(12) United States Patent
Slave et al.

(10) Patent No.: US 7,385,489 B2
(45) Date of Patent: Jun. 10, 2008

(54) INSTRUMENT PANEL ASSEMBLY

(75) Inventors: Renato B. Slave, S. Caetano do Sul (BR); Fabio Iwakami, Sao Paulo (BR); Leandro Quinelato, Sao Paulo (BR); Valter Medeiros, Sao Paulo (BR)

(73) Assignee: Visteon Global Technologies, Inc., Van Buren Township, MI (US)

( * ) Notice: Subject to any disclaimer, the term of this patent is extended or adjusted under 35 U.S.C. 154(b) by 531 days.

(21) Appl. No.: 11/187,778

(22) Filed: Jul. 22, 2005

(65) Prior Publication Data

US 2007/0017790 A1 Jan. 25, 2007

(51) Int. Cl.
*B60Q 1/00* (2006.01)
(52) U.S. Cl. .................. 340/438; 340/463; 340/426.26
(58) Field of Classification Search ............. 340/425.5, 340/426.22, 426.24, 426.26, 438, 461, 463, 340/815.45, 815.47; 345/50, 161; 359/630, 359/631; 362/27
See application file for complete search history.

(56) References Cited

U.S. PATENT DOCUMENTS

| | | | |
|---|---|---|---|
| 3,675,241 A | 7/1972 | Glaser | |
| 4,671,615 A * | 6/1987 | Fukada et al. | 345/50 |
| 4,990,896 A | 2/1991 | Gray | |
| 5,627,532 A | 5/1997 | Ishiguro | |
| 5,822,099 A | 10/1998 | Takamatsu | |
| 5,949,346 A * | 9/1999 | Suzuki et al. | 340/815.45 |
| 5,997,161 A | 12/1999 | Stringfellow et al. | |
| 6,139,174 A | 10/2000 | Butterworth | |
| 6,219,035 B1 * | 4/2001 | Skog | 345/161 |
| 6,404,463 B1 | 6/2002 | Knoll et al. | |
| 6,490,776 B1 | 12/2002 | Gager et al. | |
| 6,508,563 B2 | 1/2003 | Parker et al. | |
| 6,652,128 B2 | 11/2003 | Misaras | |
| 6,674,578 B2 * | 1/2004 | Sugiyama et al. | 359/631 |
| 6,743,988 B2 | 6/2004 | Bao et al. | |
| 2003/0090161 A1 | 5/2003 | Marlow et al. | |
| 2003/0090470 A1 | 5/2003 | Wolter et al. | |
| 2003/0112618 A1 | 6/2003 | Bryant | |
| 2003/0201895 A1 | 10/2003 | Harter, Jr. et al. | |
| 2003/0210537 A1 | 11/2003 | Engelmann | |
| 2003/0214391 A1 | 11/2003 | Kondo et al. | |
| 2004/0017687 A1 | 1/2004 | Misaras | |
| 2004/0120140 A1 | 6/2004 | Fye et al. | |
| 2004/0178050 A1 | 9/2004 | Wylde | |

* cited by examiner

*Primary Examiner*—Van T. Trieu
(74) *Attorney, Agent, or Firm*—Brinks Hofer Gilson & Lione

(57) ABSTRACT

An instrument panel assembly for a passenger compartment is provided, including an instrument panel surface, a light emitter that emits a light beam so that the light beam extends along a beam path, and a light receiver that senses the light beam and detects a desired instrument setting change.

25 Claims, 7 Drawing Sheets

INSTRUMENT PANEL ASSEMBLY

BACKGROUND

1. Field of the Invention

The invention relates generally to an instrument panel assembly. More specifically, the invention relates to a light emitter and a light receiver that cooperate to detect a desired instrument setting change.

2. Related Technology

An instrument panel for the passenger compartment of a motor vehicle passenger compartment or in an aircraft cockpit typically has a plurality of instrument display components that display various vehicle settings and conditions, such as speed, mileage, and fuel level. During the operation of the vehicle, the vehicle occupant may desire to change an instrument setting, such as to reset a trip odometer or to switch the units of measurement of the display component. Direct access to a display component, however, is difficult because the instrument panel typically includes a base panel supporting the instrument display component(s) and a transparent protective cover spaced apart from the base panel to protect the instrument display components from accidental contact and to prevent dirt and dust from collecting thereon.

To make these components accessible to the vehicle operator, a mechanically-actuated instrument control member typically extends from the base panel, across a gap distance, and through an opening in the protective cover. A typical control member is an elongated, generally cylindrical, rod or knob that is able to be rotated and/or depressed by the vehicle operator to change a vehicle display setting. One common mode of operation is for this type of knob to be rotated to change an odometer display between a "trip odometer mode" and a "vehicle odometer mode" and to be depressed to reset the trip odometer.

This type and other types of mechanically-actuated instrument control members typically must extend across the gap distance between the respective panels, which may be aesthetically undesirable. Furthermore, the opening in the protective panel for the knob may allow dirt or other debris to gain access to and collect on the surface instrument display components.

Another type of instrument control assembly utilizes an optoelectronic keypad to detect desired instrument setting changes. More specifically, as disclosed in U.S. Application Publication No. 2003/0090470, published on May 15, 2003, an optoelectronic keyboard is spaced apart from a light emitter and a light receiver, which are adjacent to each other. The light emitter emits light towards a keyboard surface in a direction that is perpendicular thereto when the keyboard is in its natural resting position. Therefore, the light is reflected back to the light emitter (as opposed to being reflected to the light receiver) when the keyboard is in its natural resting position. However, when a user depresses a portion of the keyboard during operation of the control assembly, the keyboard surface is deflected and the light emanating from the light emitter is reflected in multiple, random directions. The light receiver is positioned along on the path of one or more of the deflected directions so as to receive the light and complete an electrical connection between the light emitter and the light sensor. This type of control assembly, however, may fail to complete the electrical connection due to unpredictable or inconsistent light deflection based on slight variations in the position of the user's finger when depressing the keyboard and based on slight variations in the depressing force used. Furthermore, multiple light receivers to receive the unpredictable light may increase the complexity and/or increase the component cost of the assembly.

It is therefore desirous to provide an instrument control assembly that consistently and accurately detects a desired instrument setting change while having a relatively simple, low cost design and an aesthetically pleasing design.

SUMMARY

In overcoming the limitations and drawbacks of the prior art, the present invention provides an instrument panel assembly for a passenger compartment. The assembly includes a light emitter that emits a light beam so that the light beam extends along a beam path. At least a portion of the beam path extends generally along a plane that is parallel to the instrument panel surface. A light receiver senses the light beam and detects a desired instrument setting change.

In one design, the instrument panel assembly includes deflectors positioned along the beam path to separate the beam path into a first portion, a second portion extending along the direction generally parallel with the plane, and a third portion. In this design, the first and second portions of the beam path each extend through the instrument panel so that the second portion of the beam path is accessible to an instrument panel user. For example, the instrument panel user may position his or her finger along the second portion of the beam path to interrupt the light beam and indicate to the light reflector a desired instrument setting change. The first and third portions of the beam path may each be respectively defined by a light beam track extending through the instrument panel surface.

In another design, the instrument panel assembly further includes an adjustment member with an obstructing portion to selectively obstruct the beam path and to interrupt the light beam to detect a desired instrument setting change. The adjustment member is adjustable between a plurality of positions. For example, the adjust member may be a rotatable knob. This design may further include a second light emitter and a second light receiver for detecting a second desired instrument setting change. The assembly may also include a side panel extending between the base panel and the protective panel and supporting the light emitter and the light receiver.

In another aspect of the present invention, the instrument panel assembly includes a base panel for supporting at least one instrument display component, a protective panel spaced apart from the base panel by a gap distance, a light emitter, and a light receiver. The light emitter and the light receiver cooperate to define a beam path, at least a portion of which extends along a direction that cooperates with the protective panel to define an angle that is substantially less than 90 degrees. The angle is preferably less than 45 degrees and is more preferably equal to 0 degrees.

Further objects, features and advantages of this invention will become readily apparent to persons skilled in the art after a review of the following description, with reference to the drawings and claims that are appended to and form a part of this specification.

DETAILED DESCRIPTION

Figure 1:
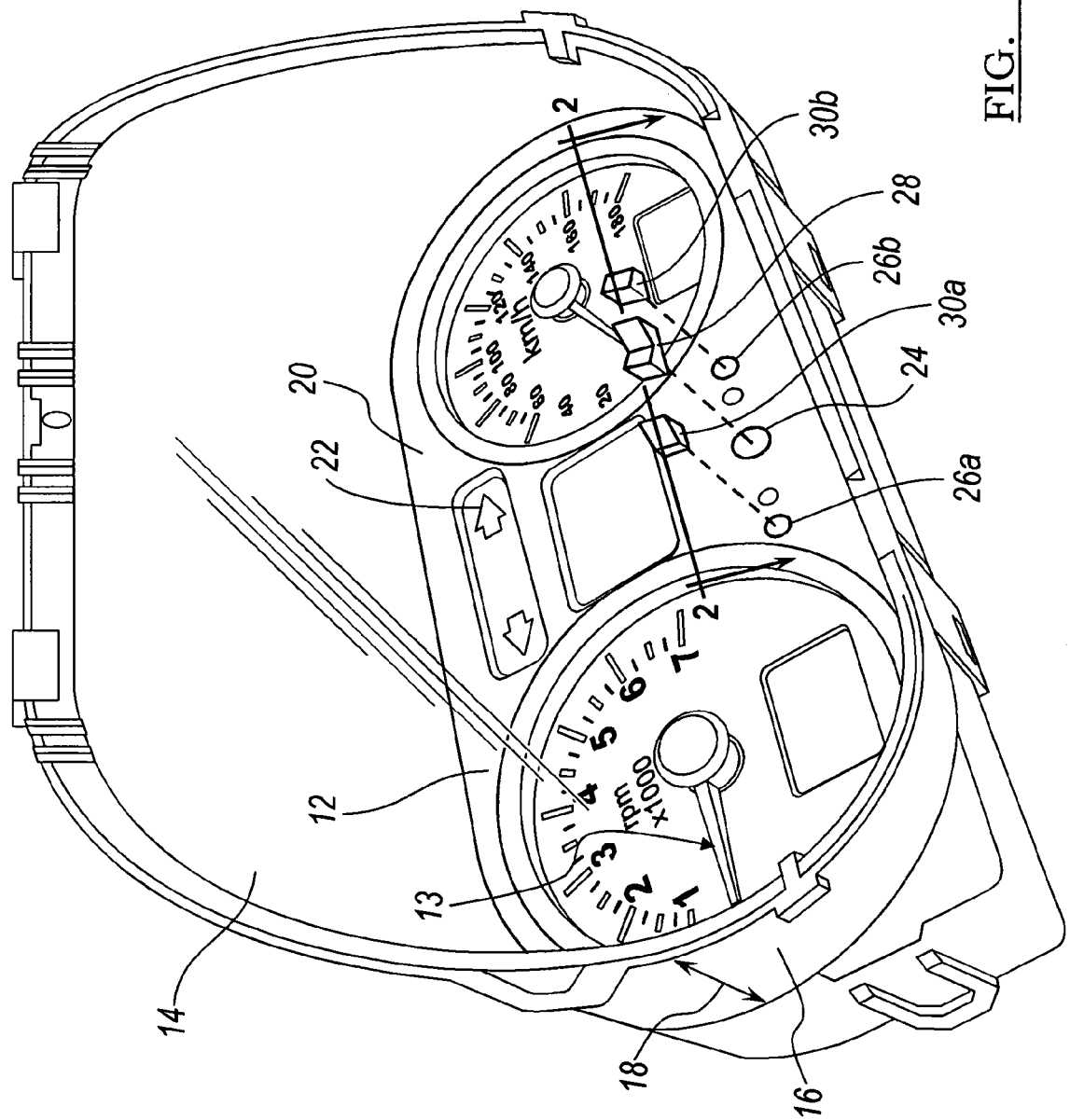
FIG. 1 is an instrument panel assembly embodying the principles of the present invention for use in an instrument panel of a motor vehicle.

Referring now to the drawings, FIG. 1 shows an instrument panel assembly 10 for a passenger compartment of a vehicle, such as an instrument panel of a motor vehicle or aircraft cockpit. The instrument panel assembly 10 generally includes a base panel 12, a protective panel 14 spaced apart from the base panel 12 by a gap distance 18, and a side panel 16 extending therebetween and connecting the respective components 12, 14. The base panel 12 houses or supports a plurality of instrument display components 13, such as system gauges (odometer, speedometer, RPM gauge, and the like) and electronic indicator lights (odometer, check engine light, low battery light, and the like). The protective panel 14, which is typically transparent, protects the instrument display components 13 from accidental contact, from being tampered, and from contamination by particulates, such as dust and dirt. The protective panel 14 preferably includes a non-glare coating to assist the vehicle occupant in viewing the instrument display components 13.

The base panel 12 includes opaque portions 20 that cover the internal components of the instrument panel for aesthetic purposes, and translucent or transparent portions 22 that allow light to pass therethrough from an electronic indicator light located below the base panel 12. The base panel 12 is preferably a plastic panel formed by any suitable means, such as by injection molding. The instrument display components 13 are preferably connected or mounted to the base panel 12 by any suitable means. Alternatively, the respective components 12, 13 can be unitarily formed as a single part. Similarly, the side panel 16 are connected to the base panel 12 by heat staking or any other suitable fastening means, or be unitarily formed as a single part.

The instrument panel assembly 10 includes a light emitter 24 and at least one light receiver 26 for detecting a vehicle occupant's desired instrument setting change. For example, the light emitter 24, which is supported by the base panel 12, emits a light beam that is eventually received by the light emitter 24. When the light beam is interrupted by the vehicle occupant, the light receiver 26 no longer receives the light beam and the desired instrument setting change is detected.

Figure 2A:
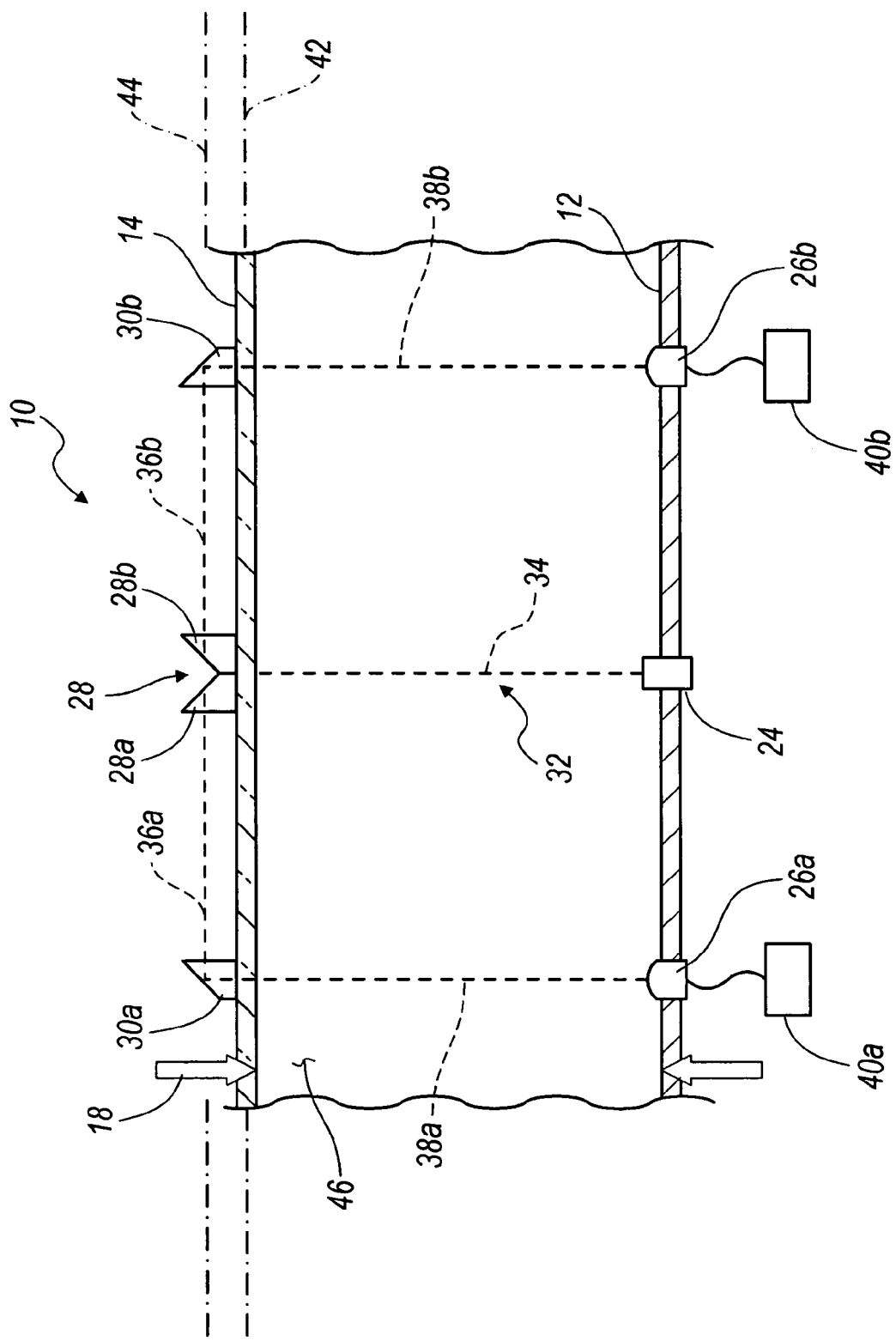
FIG. 2*a* is a cross-sectional view taken along line 2-2 in FIG. 1 showing various components that cooperate to define a pair of light beam paths.
Figure 2B:
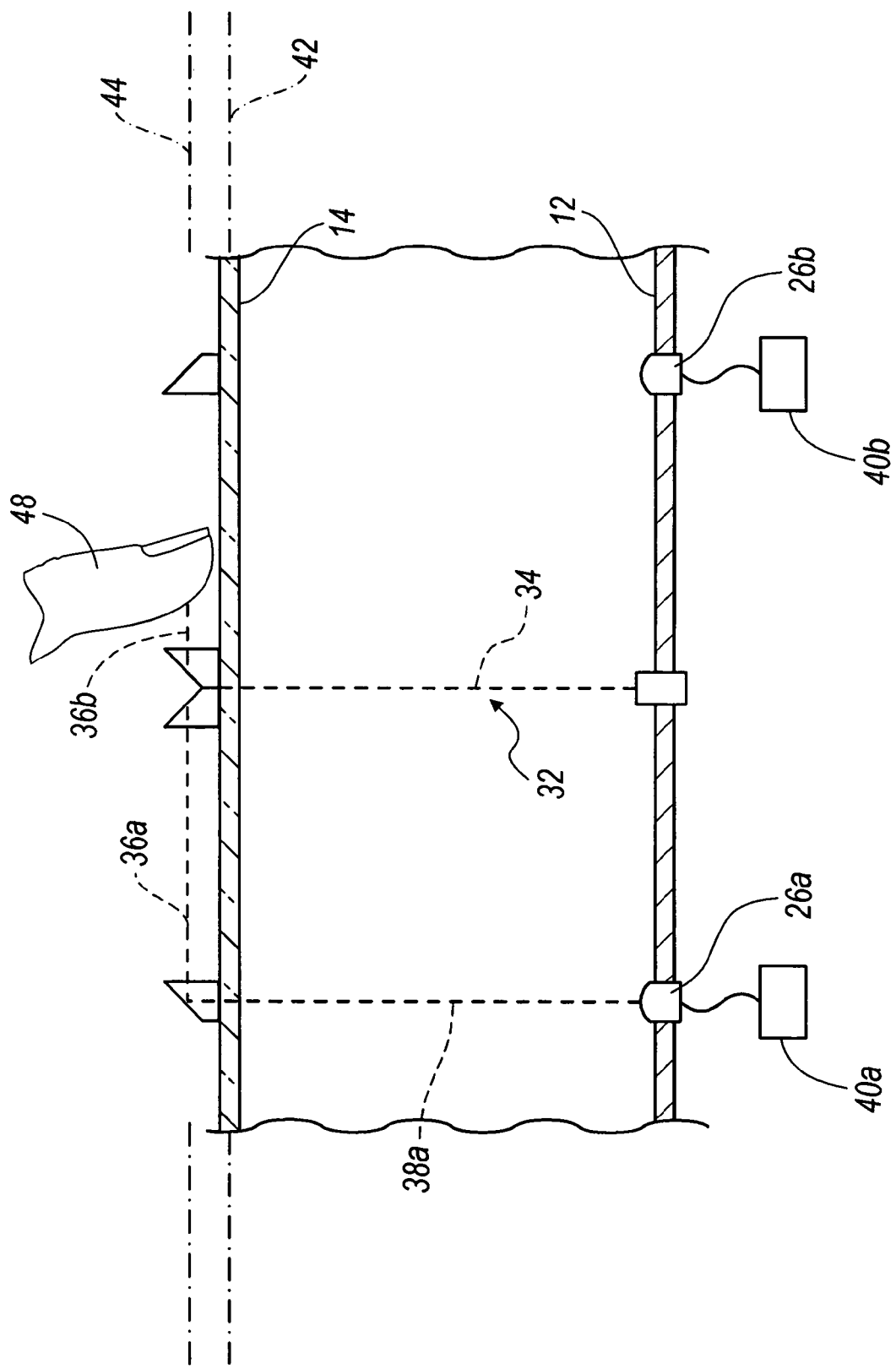
FIG. 2b is a cross-sectional view similar to that in FIG. 2a, showing a vehicle occupant's finger interrupting one of the light beam paths.

Referring to FIGS. 1 through 2b, the light emitter 24 cooperates with a first deflector 28 and an outer deflector 30 to define a beam path 32. More specifically, the light beam travels along a first portion 34 of the beam path 32 between the light emitter 24 and the first deflector 28. The first deflector 28 includes a pair of deflecting surfaces 28a, 28b that divide the light beam in opposing directions to define respective second portions 36a, 36b of the beam path 32. Next, the light beams are each deflected by the respective outer deflectors 30a, 30b to define respective third portions 38a, 38b of the beam path 32. The light beams are then received by the light receivers 26a, 26b to complete a circuit and to indicate the same to a pair of controllers 40a, 40b.

Each of the controllers 40a, 40b controls a different instrument display component 13 or a different facet of a single instrument display component. For example, the left controller 40a may control whether the odometer displays the vehicle mileage or the trip mileage and the right controller may reset the trip odometer. Alternatively, panel assembly 10 includes a single controller for controlling multiple instrument display components.

The first and third portions 34, 38a, 38b of the beam path 32 extend in a direction generally normal to a plane 42 defined by the protective panel 14. The respective second portions 36a, 36b of the beam path 32 are directed generally parallel with the protective panel 14 and are each located outside of the instrument panel cavity 46 so as to be accessible to the vehicle occupant for interruption thereof, as is shown in FIG. 2b, by a vehicle occupant's finger 48. When interrupted, one of the light receivers 26b (light receiver in FIG. 2b) no longer receives the light beam, thereby indicating to its respective controller of a desired instrument setting change. More specifically, continuing with the example mentioned above, the vehicle occupant's interruption of the right (with regard to FIG. 2b) second portion 36b of the beam path 32 resets the trip odometer. The left second portion 36a of the beam path 32 is uninterrupted, thereby indicating to the left controller 40a that the vehicle occupant does not wish to switch between the vehicle mileage and the trip mileage at this time.

The respective second portions 36a, 36b of the beam path 32 each preferably extend along a direction 44 that is substantially less than 90 degrees with respect to the plane 42 defined by the protective panel 14 so that the respective deflectors 28, 30 are able to have generally equal, relatively small heights (less than 6 centimeters). More specifically, the direction 44 is preferably generally parallel to the plane 42 defined by the protective panel 14 so that the vehicle occupant will be able to consistently and reliably interrupt the beam path 32 at any point along the second portion 36a. Additionally, the deflectors 28, 30 preferably extend at least a few millimeters or centimeters from the outer surface of the protective panel 14 so that the vehicle occupant is able to interrupt the beam path 32 without touching the protective panel 14.

Although the instrument panel assembly 10 is shown having two light beam-dividing-deflectors 28a, 28b, any suitable number of light beam-dividing-deflectors may be used with the present invention. Alternatively, the light beam is not divided and instead travels along a single beam path. Furthermore, although the instrument panel assembly 10 is shown having a total of three beam path portions 34, 36, 38, any suitable number of beam path portions may be used with the present invention. The number and configuration of deflectors, sensors, and emitters may vary depending on these modifications.

Figure 3:
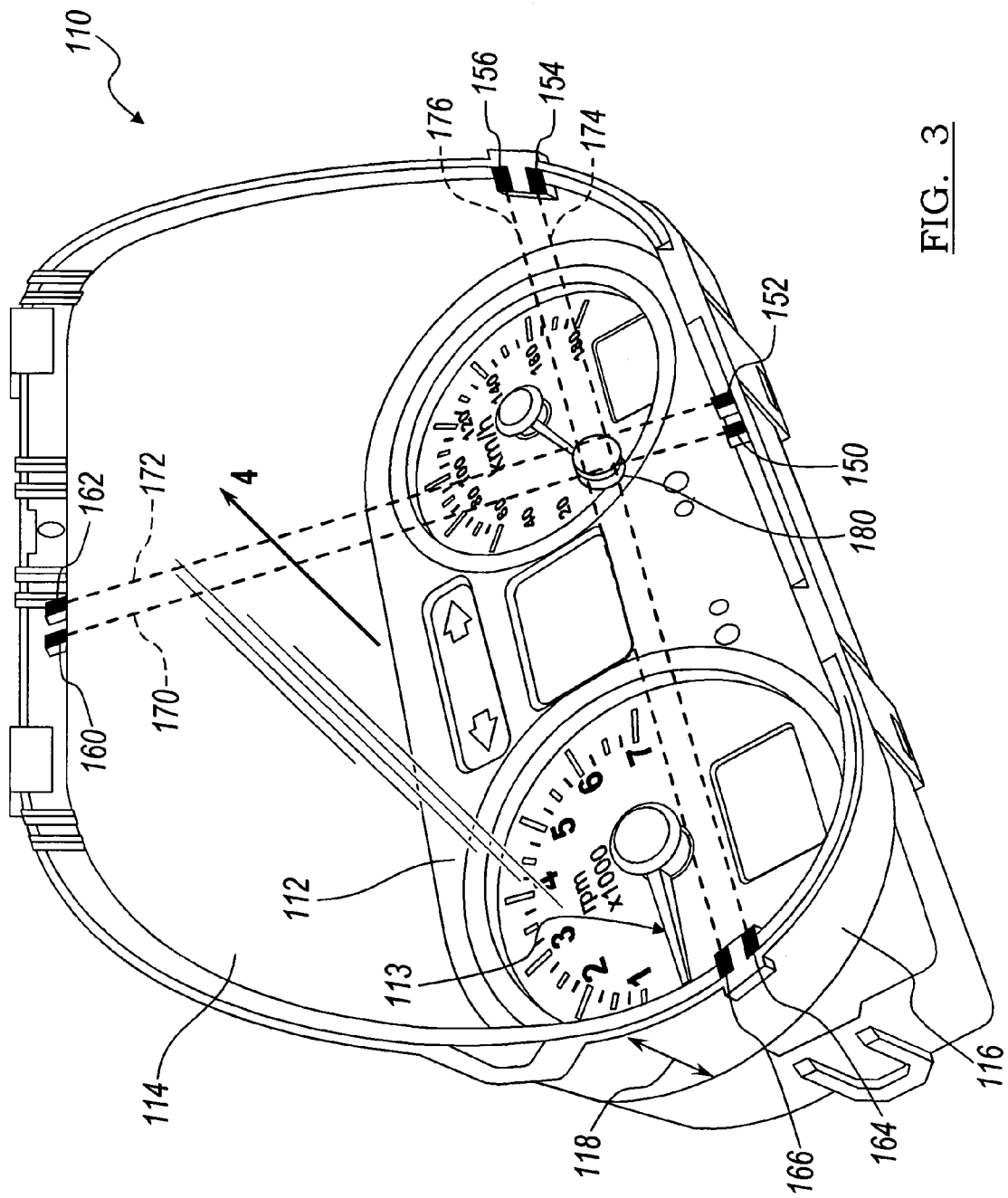
FIG. 3 is an alternative design of an instrument panel assembly embodying the principles of the present invention.
Figure 4:
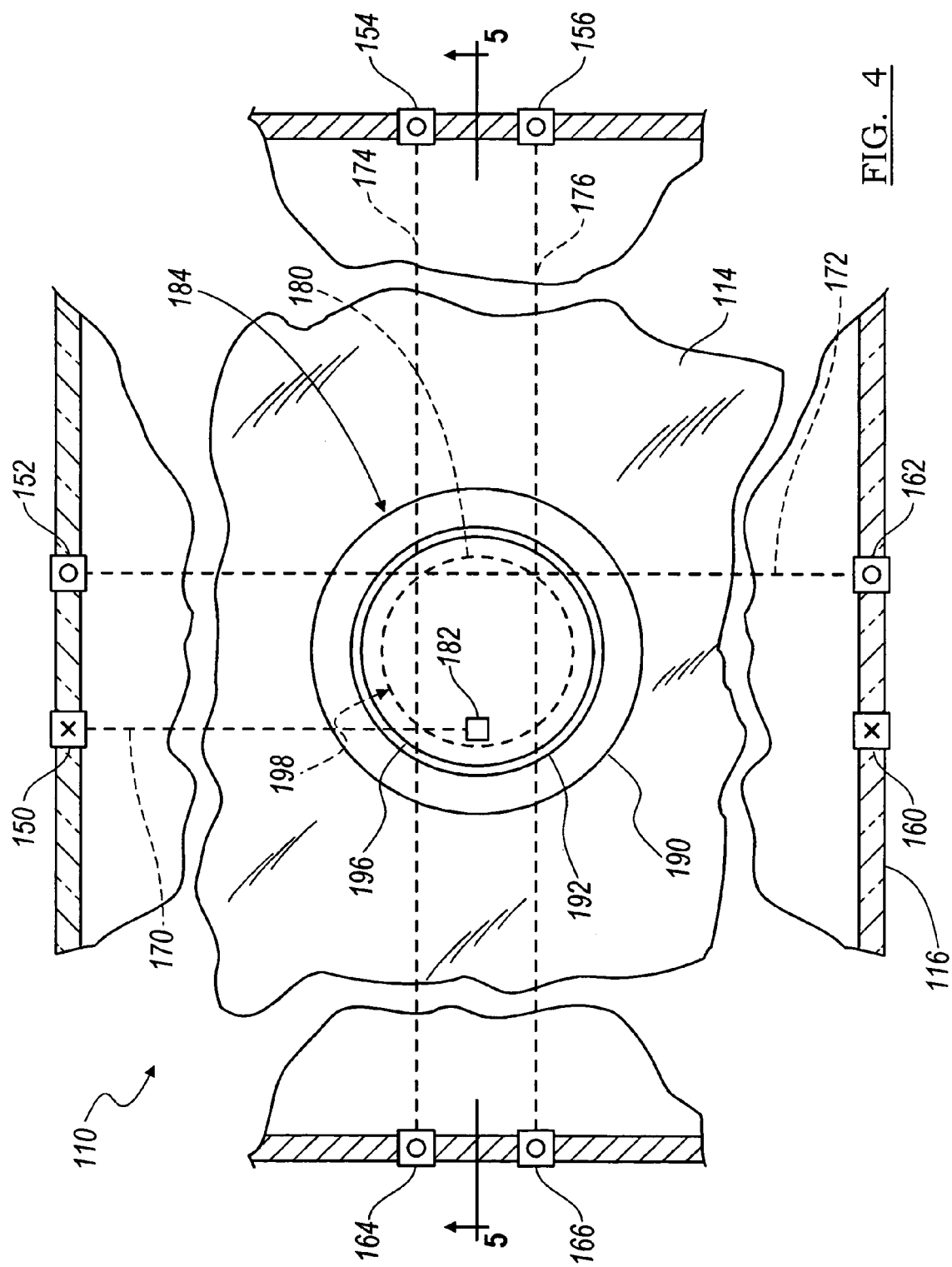
FIG. 4 is a bottom view of the instrument panel assembly shown in FIG. 3 along the direction of line 4 in FIG. 3.
Figure 5:
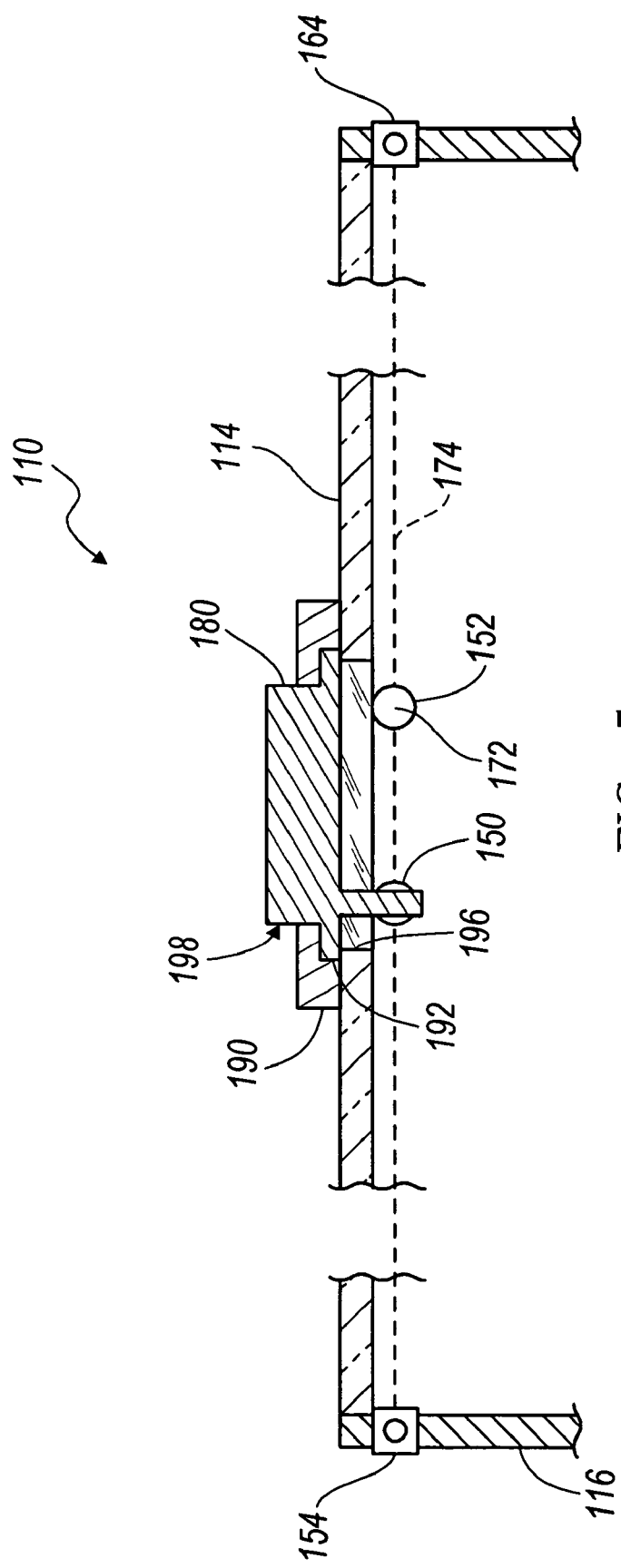
FIG. 5 is a cross-sectional view of the instrument panel assembly taken along line 5-5 in FIG. 4.

Referring now to FIGS. 3-5, an alternative instrument panel assembly 110 is shown therein as having a base panel 112 that houses or supports a plurality of instrument display components 113, a protective panel 114 spaced apart from the base panel by a gap distance 118, and a side panel 116 connecting the respective components 112, 114. Four light emitters 150, 152, 154, 156 and corresponding light receivers 160, 162, 164, 166 are supported by the side panel 116 and are generally aligned with each other to define four beam paths 170, 172, 174, 176. The respective light emitters 150, 152, 154, 156 and light receivers 160, 162, 164, 166 are connected to the side panel 116 by any suitable connection, such as being fastened or unitarily molded with the side panel 116, such that the respective light emitting and light receiving portions are unobstructed by the side panel 116. More specifically, the respective light emitters 150, 152, 154, 156 and light receivers 160, 162, 164, 166 are preferably within or flush with the side panel 116 to remain substantially hidden to the vehicle occupant. Additionally, the respective light emitters 150, 152, 154, 156 and light receivers 160, 162, 164, 166 are preferably positioned below the protection panel 114 relatively close to the protective panel 114 (within a few millimeters or centimeters), as will be discussed in more detail below.

The instrument panel assembly 110 also includes an adjustment member, such as a knob 80, that is rotatably supported by the protective panel 114. The knob 180 can be rotated to selectively interrupt one or more of the beam paths 170, 172, 174, 176 and to thereby indicate a desired instrument setting change to the controllers that are coupled with the respective light receivers 160, 162, 164, 166. For example, the protective panel 114 includes an opening 196 that rotatably receives the knob 180 and through which the obstruction 182 is able to extend. The knob 180 is rotatably coupled to the protective panel 114 by a knob base 190, which includes a knob flange 192 that secures the knob 180 in place. The knob base 190 is fixably secured to the protective panel 114 by any appropriate means, such as adhesives or fasteners. Furthermore, the knob 180 may also include a knurled gripping surface 198 to assist rotation thereof.

As seen in the underside view of FIG. 4, a protrusion 182 extends from a lower surface of the knob 180 into the chamber defined by the respective panels 112, 114, 116. The protrusion 182 has a length so as to selectively obstruct the beam paths 170, 172, 174, 176. For example, when the knob 180 is rotated to a first position 184 shown in FIGS. 4 and 5, the protrusion 182 is aligned with the light emitter 150 and the light receiver 160 and interrupts the beam path 170 therebetween and indicates a particular instrument setting to the controller. Similarly, as the knob 180 rotates (at 90° intervals in the illustrations), the other beam paths 172, 174, 176 will become interrupted and indicate various signals to the controller.

Figure 6:
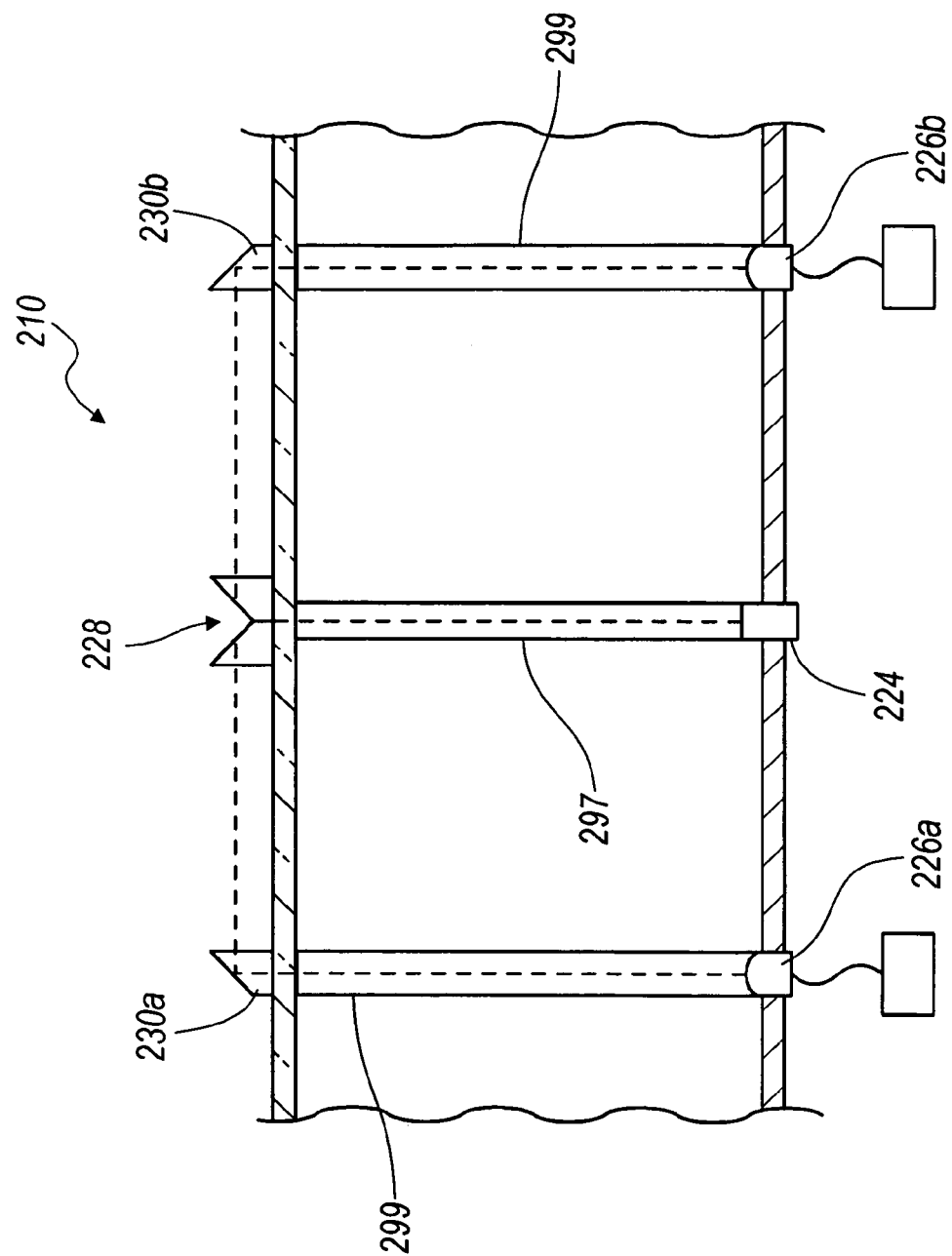
FIG. 6 is a cross-sectional view similar to that in FIG. 2a, showing another alternative design of an instrument panel assembly embodying the principles of the present invention.

In another alternative embodiment shown in FIG. 6, instrument panel assembly 210 includes a light track 297 extends between the light emitter 224 and includes a deflector 228. A second pair of light tracks 299 extends between the outer deflectors 230a, 230b and the respective light receivers 226a, 226b. The light tracks are preferably formed of a polycarbonate pipe, an optical fiber, or any other material that permits light passage therethrough. The light tracks 297, 299 may improve the travel of light between the light emitter 224 and the light receivers 226a, 226b by ensuring a linear light path regardless of the type of light source used. For example, the light tracks 297, 299 are able to focus the light emitted from a light source, such as incandescent light source, into a focused, linear beam path. As a result, a light source with a reduced intensity may be able to be used in the above described instrument panel.

The controllers used in conjunction with the above instrument panel assemblies preferably utilize a Schmitt trigger concept (for discrete or analog systems) that is generally known in the art. Furthermore, the light emitters are preferably infrared light emitting diodes (LED's), but colored LED's or conventional light bulbs may be alternatively used. The aspects of the invention may also be utilized with other passenger compartment controls, such as audio devices, HVAC units, and the like.

The above instrument panel assemblies allow the vehicle occupant to easily and reliably adjust an instrument display component setting without having to adjust a mechanical component that extends clear through the instrument panel cavity, thereby improving the aesthetics and the function of the instrument panel.

It is therefore intended that the foregoing detailed description be regarded as illustrative rather than limiting, and that it be understood that it is the following claims, including all equivalents, that are intended to define the spirit and scope of this invention.

What is claimed is:

1. A switch assembly for an instrument panel assembly in a vehicle a passenger compartment comprising:
    an instrument panel having a surface generally defining a plane;
    a light emitter supported by the instrument panel and configured to emit a light beam along a beam path that extends in a direction generally parallel with the plane; and
    a light receiver supported by the instrument panel and configured to sense the light beam; and
    a controller coupled to the light receiver and configured to detect interruptions in the light beam sensed by the light receiver indicative of a desired instrument setting change of the instrument panel.

2. A switch assembly for an instrument panel assembly as in claim 1, further comprising at least one deflector positioned along the beam path to separate the beam path into first and second portions, wherein the second portion of the beam extends in the direction generally parallel with the plane.

3. A switch assembly for an instrument panel assembly as in claim 2, wherein the first portion of the beam path extends through the instrument panel surface.

4. A switch assembly for an instrument panel assembly as in claim 2, wherein the second portion of the beam path is located on a side of the surface toward the passenger compartment.

5. A switch assembly for an instrument panel assembly as in claim 1, wherein a portion of the beam path is located on a side of the surface toward the passenger compartment.

6. A switch assembly for an instrument panel assembly as in claim 1, wherein a portion of the beam path is located on a side of the surface away from the passenger compartment.

7. A switch assembly for an instrument panel assembly as in claim 1, further comprising an adjustment member mounted to the surface and being movable to selectively obstruct the beam path.

8. A switch assembly for an instrument panel assembly as in claim 7, wherein the adjustment member includes a protrusion extending therefrom and being moveable to obstruct the beam path.

9. A switch assembly for an instrument panel assembly as in claim 1, wherein the light emitter is a light emitting diode.

10. A switch assembly for an instrument panel assembly as in claim 1, wherein the light beam is an infrared beam.

11. A switch assembly for an instrument panel assembly in a vehicle passenger compartment comprising:
    a base panel configured to support at least one instrument display component;
    a protective panel defining a plane and spaced apart from the base panel by a gap distance;
    a light emitter supported by the instrument panel and configured to emit a light beam along a beam path so that at least a portion of the beam path extends at an angle less than 90 degrees with respect to the plane;
    a light receiver supported by the instrument panel and configured to sense the light beam; and a controller coupled to the light receiver and configured to detect interruptions in the light beam sensed by the light receiver indicative of a desired instrument setting change of the instrument panel.

12. A switch assembly for an instrument panel assembly as in claim 11, wherein the angle is less than 45 degrees.

13. A switch assembly for an instrument panel assembly as in claim 12, wherein the angle is generally equal to 0 degrees.

14. A switch assembly for an instrument panel assembly as in claim 11, wherein the light emitter and the light receiver are supported by the base panel.

15. A switch assembly for an instrument panel assembly as in claim 14, further comprising first and second deflectors supported by the protective panel and configured to deflect the light beam so that a first portion of the beam path extends between the light emitter and the first deflector, a second portion of the beam path extends between the first deflector and the second deflector, and a third portion of the beam path extends between the second deflector and the light receiver.

16. A switch assembly for an instrument panel assembly as in claim 15, wherein the first portion and the third portion of the beam path each extend through the protective panel.

17. A switch assembly for an instrument panel assembly as in claim 15, wherein the second portion of the beam path is located on a side of the surface toward the passenger compartment.

18. A switch assembly for an instrument panel assembly as in claim 15, further comprising:
 a third deflector supported by the protective panel and cooperating with the first deflector to separate the light beam into a first light beam extending along the beam path and a second light beam extending along a second beam path;
 a fourth deflector supported by the protective panel and cooperating with the third deflector to define the second beam path; and
 a second light receiver supported by the base panel and configured to sense the light beam of the second beam path to detect a second desired instrument setting change.

19. A switch assembly for an instrument panel assembly as in claim 11, further comprising an adjustment member mounted to the protective panel and being moveable to selectively obstruct the beam path.

20. A switch assembly for an instrument panel assembly as in claim 19, wherein the light emitter and the light receiver are aligned with each other so that the beam path is generally linear.

21. A switch assembly for an instrument panel assembly as in claim 19, wherein the adjustment member is a rotatable knob.

22. A switch assembly for an instrument panel assembly as in claim 19, further comprising a second light emitter and a second light receiver.

23. A switch assembly for an instrument panel assembly as in claim 22, further comprising a third light emitter, a third light receiver, a fourth light emitter, and a fourth light receiver.

24. A switch assembly for an instrument panel assembly as in claim 19, further comprising a side panel extending between the base panel and the protective panel, wherein the light emitter and the light receiver are each connected to the side panel.

25. A switch assembly for an instrument panel assembly as in claim 11, further comprising a light beam track extending along at least a portion of the beam path.

* * * * *